United States Patent [19]

Baker

[11] 3,997,799

[45] Dec. 14, 1976

[54] SEMICONDUCTOR-DEVICE FOR THE STORAGE OF BINARY DATA

[76] Inventor: Roger T. Baker, Box 240, Parsippany Troy Hills, N.J. 07878

[22] Filed: Sept. 15, 1975

[21] Appl. No.: 613,189

[52] U.S. Cl. .............................. 307/238; 307/304; 340/173 CA; 357/24; 357/45

[51] Int. Cl.$^2$ .................. H03K 5/00; H03K 3/353; H01L 29/78

[58] Field of Search ......... 357/24; 307/238, 221 D, 307/304; 340/173 CA

[56] References Cited

UNITED STATES PATENTS 3,720,922   3/1973   Kosonocky .......................... 357/24

OTHER PUBLICATIONS

Baertsch et al., "A New Surface Charge Analog Store" IEEE Int. Electron Devices Meeting Tech. Dig. (12/73) pp. 134–137.

Primary Examiner—William D. Larkins
Assistant Examiner—Gene M. Munson

[57] ABSTRACT

A semiconductor device for the storage of binary data and means for electrically selecting a particular device from an array of such devices and either recalling the data stored therein, or introducing data to be stored therein, or both. The device includes two conducting electrodes in close proximity to each other and separated from a semiconducting material by a layer of electrically insulating material. Voltages of the correct polarity applied between the electrodes and the semiconductor induce depletion regions in the semiconductor. The device also includes a P-N junction in the semiconducting material in a region near one of the depletion regions. Binary data is entered in, maintained in, and recalled from the device by manipulating the voltages applied to the two electrodes, and controlling the voltage applied across the P-N junction.

7 Claims, 3 Drawing Figures

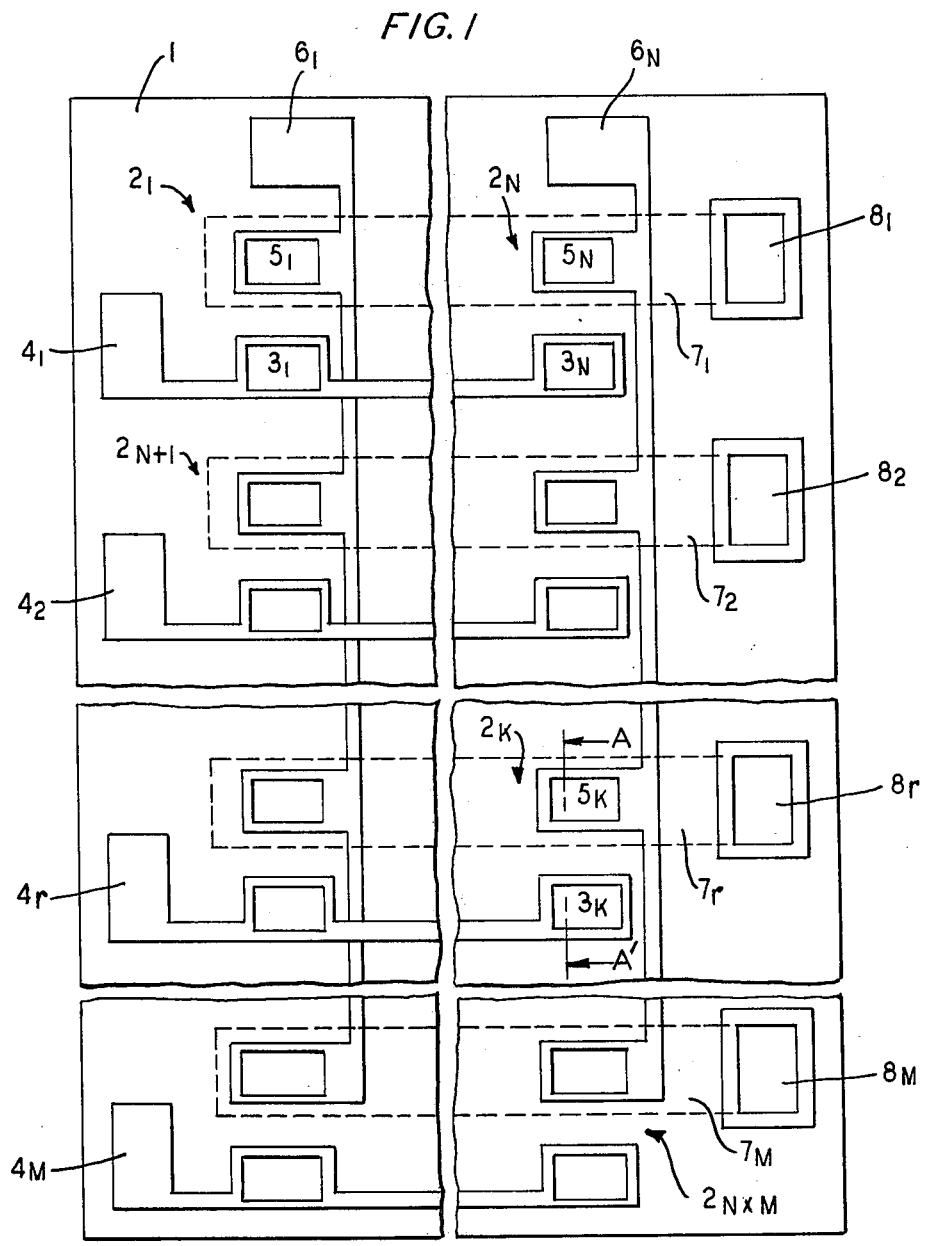

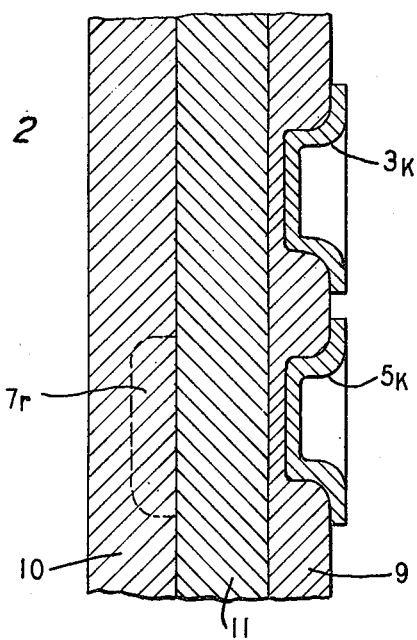
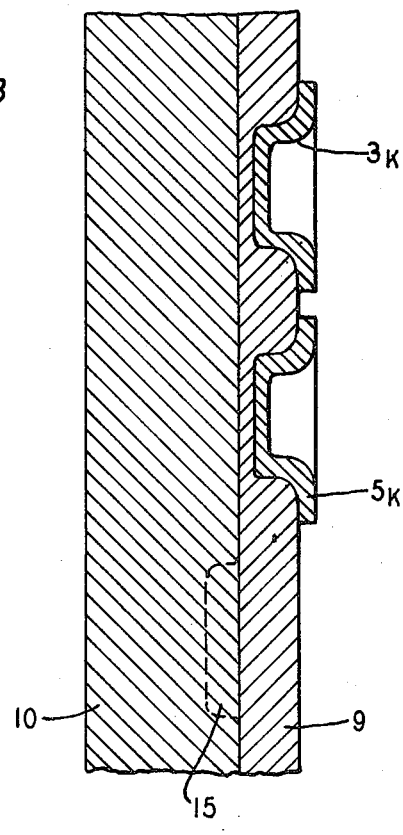

SEMICONDUCTOR-DEVICE FOR THE STORAGE OF BINARY DATA

BACKGROUND OF THE INVENTION

1. Field of the Invention

This invention relates to a novel semiconductor device for use in semiconductor random access memories and means for selecting a particular device from a plurality of such devices for the purpose of recalling data from the selected device, storing data in the selected device, or both.

2. Description of the Prior Art

The cost of manufacturing integrated circuit semiconductor memories decreases as the amount of processing required in the manufacture of the memory decreased, and decreases as the size of the semiconductor surface area required per stored bit decreases. In the past integrated circuit semiconductor memories have been manufactured using either charge control devices (CCDs), or metal-insulator-semiconductor field effect transistors (MISFETs), or bipolar transistors, or a combination of the above devices. Semiconductor memories which utilize charge control devices for the storing of binary data usually require less processing in their manufacture and require less semiconductor surface area per stored bit then do semiconductor memories which utilize either MISFETs or bipolar transistors for the storage of binary data. In the past, only the shift register (SR), also known as a serial register, type of memories have been manufactured using CCDs. A disadvantage of SR memories compared to random access type memories (RAMs) is that SR memories usually require either more extensive support circuitry, or more complex support circuitry, or both, than RAMs do. Also, due to the serial organization of data stored in SRs, in some applications, the time interval between the request for a particular bit of stored data and the appearance of the data at the output terminals of the memory will be delayed by the requirement to shift a significant amount of the data stored in the SR. Another disadvantage of using CCDs in SR memories is that during charge transfer, a fraction of the charge in each CCD may not be transferred to the succeeding CCD, and as a consequence the signal is degraded during every charge transfer. Therefore the number of CCDs in a single SR is limited. Another disadvantage of CCDs is that in one embodiment they require three surface electrodes, which with the limitations on electrode size due to limits on the photolithographic process, requires a large amount of semiconductor surface area. Such CCDs also require a three phase clock signal which necessitates additional circuitry and may limit the speed of operation of the SR. Alternative embodiments of CCDs used in SRs require fewer electrodes and less complex clock signals, but such embodiments have the disadvantage of a more complex geometry and reduced performance in comparison to three electrode CCDs.

High density RAMs which use either MISFETs only, or which use MISFETs and other electronic devices such as capacitors, often have the disadvantage that the operation of recalling data from a particular cell destroys the data which was being maintained in that cell.

SUMMARY OF THE INVENTION

Accordingly, it is an object of this invention to provide a semiconductor device for storing binary data which has a novel structure and can be used in random access integrated circuit memories and requires a minimum of processing steps it its manufacture.

It is another object of this invention to provide a semiconductor device for use in integrated circuit random access memories which can store data, recall data, or both, with a minimized execution time.

It is another object of this invention to provide a semiconductor device for use in integrated circuit random access memories which uses a minimized semiconductor surface area per stored bit.

It is another object of this invention to provide a semiconductor device for use in integrated circuit random access memories which can operate using minimized power.

It is another object of this invention to provide a novel structure and organization for charge control devices in which partial charge transfer effects do not limit the maximum size of the memory.

It is another object of this invention to provide a novel structure and organization for charge control devices in which a minimum of external support circuitry is required for operation of the memory.

It is another object of this invention to provide a semiconductor device for use in integrated circuit memories in which the data stored in one such device is not destroyed by the operation of recalling the data stored in that device.

It is another object of this invention to provide a novel structure of charge control devices in which each data storage cell in a two dimensional array of such cells can be separately addressed.

The foregoing and other objects, features, and advantages of the invention will be apparent from the following more particular description of the invention, as illustrated in the accompanying drawings.

BRIEF DESCRIPTION OF THE DRAWINGS

FIG. 1 is a top view showing an array of semiconductor devices according to the present invention.

FIG. 2 is a longitudnal sectional view taken along line A—A' in FIG. 1.

FIG. 3 is a longitudnal sectional view of an alternative embodiment of the present invention.

FIG. 1 is a top view of wafer 1 on which CCDs $2_1, 2_2, \ldots 2_{N \times M}$, all having essentially the same geometry, being essentially of the same size, and having essentially the same electrical characteristics, form an array. Each CCD $2_1, 2_2, \ldots 2_{N \times M}$ appears in one row and in one column and each has its Y electrode $3_1, 3_2, \ldots 3_{N \times M}$ connected to one of the Y conductive strips $4_1, 4_2, \ldots 4_M$ corresponding to the row in which it is located. Each CCD $2_1, 2_2, \ldots 2_{N \times M}$ has its X electrode $5_1, 5_2, \ldots 5_{N \times M}$ connected to one of the X conductive strips $6_1, 6_2, \ldots 6_N$ corresponding to the column in which it is located. The semiconductor strips $7_1, 7_2, \ldots 7_M$ are parallel to the Y conductive strips $4_1, 4_2, \ldots 4_M$ and pass beneath the X electrodes $5_1, 5_2, \ldots 5_{N \times M}$ but not beneath the Y electrodes $3_1, 3_2, \ldots 3_{N \times M}$. Each of the semiconductor strips $7_1, 7_2, \ldots 7_M$ terminates on one end on one of the conducting terminals $8_1, 8_2, \ldots 8_M$.

In particular, in FIG. 1 the kth CCD $2_k$ is shown with its Y electrode $3_k$ connected to the rth Y conductive strip $4_r$, and its X electrode $5_k$ connected to the Nth X conductive strip $6_N$, and with the rth semiconductor strip $7_r$ passing beneath its X electrode $5_k$. The rth semiconductor strip $7_r$ is in turn connected to the rth conducting terminal $8_r$.

FIG. 2 shows an enlarged longitudnal section taken along the line A—A' of FIG. 1 and shows the kth CCD $2_k$, of FIG. 1. The kth CCD $2_k$ is an arbitrary and representative example of the CCDs $2_1, 2_2, \ldots 2_{N \times M}$ of FIG. 1, and the following description of the kth CCD $2_k$ is valid for any and all of the other CCDs $2_1, 2_2, \ldots 2_{N \times M}$. In the drawing 9 indicates the insulating layer and 10 indicates the semiconducting substrate. 11 indicates the epitaxial layer of semiconducting material which is of the same material and conductivity type as is the substrate 10. The rth semiconductor strip $7_r$ shown in cross sectional view passes beneath the kth X electrode $5_k$ and is of the same material as is the substrate 10. But the rth semiconductor strip $7_r$ has been doped to be of the opposite conductivity type as in the semiconductor substrate 10. That is, if the substrate 10 is N-type, the semiconductor strip $7_r$ is P-type and vice versa. The insulating layer 10 is thinner beneath the kth Y electrode $3_k$ and beneath the kth X electrode $5_k$ than it is in the surrounding areas. The X electrode $5_k$ is located sufficiently near the Y electrode $3_k$ so that if a strong inversion region is formed in the epitaxial layer 11 beneath the X electrode $5_k$, by, if necessary, applying an appropriate voltage between the X electrode $5_k$ and the semiconductor substrate 10, and if a strong inversion region is formed in the epitaxial layer 11 beneath the Y electrode $3_k$, by, if necessary, applying an appropriate voltage between the Y electrode $3_k$ and the semiconductor substrate 10, the two inversion regions so formed will to some entent overlap.

FIG. 3 shows an enlarged longitudnal section of an alternative embodiment of the present invention. Except for the elimination of the semiconductor strip $7_r$ of FIG. 2, and elimination of the epitaxial layer 11 of FIG. 2, and the addition of the semiconductor strip 15, the device shown in FIG. 3 is the same as the device shown in FIG. 2. The semiconductor strip 15, which is of the same semiconductor material as is the substrate 10 is doped to be the opposite conductivity type as is the substrate 10. One skilled in the art who has read and understood the operation of the device shown in FIG. 2 and described herein, can readily understand the operation of the device shown in FIG. 3.

In the structure of FIG. 1 and FIG. 2, the conducting strips $4_1, 4_2, \ldots 4_M, 6_1, 6_2, \ldots 6_N$, the X electrodes $5_1, 5_2, \ldots 5_{N \times M}$, the Y electrodes $3_1, 3_2, \ldots 3_{N \times M}$, and the terminals $8_1, 8_2, \ldots 8_M$ may all be of aluminum. The insulating layer 9 may be of silicon dioxide and the semiconductor substrate 10 and the epitaxial layer 11 may be of silicon doped N-type by the inclusion of, for example, phosphorus in the silicon. The semiconductor strips $7_1, 7_2, \ldots 7_M$ of FIG. 1 and the semiconductor strip 15 of FIG. 3 would therefore be of silicon doped P-type by the inclusion of, for example, boron in the silicon. It is readily apparent that all the semiconductor regions referred to as being of one conductivity type can be of the opposite conductivity type, and that the semiconductor substrate 10, epitaxial layer 11 and semiconductor strips $7_1, 7_2, \ldots 7_M$, and the semiconductor strip 15 may be of any appropriate semiconducting material. Furthermore it is readily apparent that all the conducting strips $4_1, 4_2, \ldots 4_M, 6_1, 6_2, \ldots 6_N$, the X electrodes $5_1, 5_2, \ldots 5_{N \times M}$ and the Y electrodes $3_1, 3_2, \ldots 3_{N \times M}$ and the terminals $8_1, 8_2, \ldots 8_M$ may be of any suitable conducting materials and that the insulating layer 9 may be of any appropriate insulator.

To facilitate the description of this invention, it will be presumed hereafter that the substrate 10 is at ground potential, and that furthermore any voltage source which is specified as being applied to any particular electrode, conductive strip, or terminal is in fact applied between the specified electrode, conductive strip, or terminal and the substrate 10. Binary data can be entered in, maintained in, and recalled from any particular one of the CCDs $2_1, 2_2, \ldots 2_{N \times M}$ FIG. 1 without adversely affecting the data stored in all the other CCDs $2_1, 2_2, \ldots 2_{N \times M}$. To facilitate the description of this invention, the sequence of operations required to enter data in, to maintain data in, and to recall data from any particular CCD, the above operations will be described for one specific CCD. In particular, let the kth CCD $2_k$ FIG. 1 and FIG. 2 be selected for the above descriptive purposes.

Binary data is entered, maintained, and recalled from the kth CCD $2_k$ by manipulating the voltages applied to the Nth X conductive strip $6_N$, to the rth Y conductive strip $4_r$, and to the rth conducting terminal $8_r$. The polarity and magnitude of the voltages necessary for the proper operation of this invention depends on the materials used in the manufacture of the device, the processes used in the manufacture of the device, the electronic properties of the interface between the semiconductor epitaxial layer 11 and the insulating layer 9, and the specific geometry and dimensions of the CCDs $2_1, 2_2, \ldots 2_{N \times M}$. Therefore the magnitude and polarity of the voltage sources required for proper operation of this invention will be specified in terms of the operational effect of the voltage sources when applied to the electrodes, conductive strips, or terminals of this invention. The voltage level $V_1$ must be one of the voltage levels which if applied to the kth Y electrode $3_k$ would cause a strong inversion layer to form in the region of the epitaxial layer 11 generally beneath the kth Y electrode $3_k$. The voltage level $V_2$ must be one of the voltage levels which if applied to the kth X electrode $5_k$ would cause a strong inversion layer to form in the region of the epitaxial layer 11 generally beneath the kth X electrode $5_k$, and furthermore would cause the edge of the depletion region so formed in the epitaxial layer 11 to be within a small number of or a fraction of minority carrier diffusion lengths from the nearest point of the semiconductor strip $7_r$. The voltage level $V_3$ must be one of the voltage levels which if applied to the kth X electrode $5_k$ would cause a strong inversion layer to form in the region of the epitaxial layer 11 generally beneath the kth X electrode $5_k$, and furthermore would cause the edge of the depletion region so formed in the epitaxial layer 11 to be further than a small number of minority carrier diffusion lengths from the nearest point of the semiconductor strip $7_r$. A further requirement is that the voltage levels $V_1$ and $V_3$ must be such that if a voltage of level $V_3$ is applied to the kth X electrode $5_k$ and if a voltage of level $V_1$ is applied to the kth Y electrode $3_k$, under steady state conditions, the minority carrier density beneath the kth X electrode $5_k$ must be less than the minority carrier density beneath the kth Y electrode $3_k$. A further requirement is that the voltage levels $V_1$ and $V_2$ must be such that if a voltage of level $V_2$ is applied to the kth X electrode $5_k$ and if a voltage of level $V_1$ is applied to the kth Y electrode $3_k$, under steady state conditions, the minority carrier density beneath the kth X electrode $5_k$ must be greater than the minority carrier density beneath the kth Y electrode $3_k$.

The voltage level $V_4$ may be any of the voltage levels which if applied to the $k$th Y electrode $3_k$ would cause an accumulation layer to form in the epitaxial layer 11 generally beneath the kth electrode $3_k$. The voltage level $V_5$ may be any of the voltage levels which if applied to the kth X electrode $5_k$ would cause an accumulation layer to form in the epitaxial layer 11 generally beneath the kth X electrode $5_k$. The voltage level $V_6$ may be any of the voltage levels which if applied to the $r$th semiconductor strip $7_r$ would forward bias the PN junction formed between the epitaxial layer 11 and the semiconductor strip $7_r$. Which of the particular voltages is selected from the range of acceptable voltages defined above depends on the desired speed of operation of this invention, desired power consumption, and similar considerations which will be understood by those familiar with the art.

Binary data is entered into, maintained in, and recalled from the $k$th CCD $2_k$ by controlling the injection of minority carriers, the density of minority carriers, and the flow of minority carriers in the depletion regions formed in the epitaxial layer 11 beneath the $k$th X electrode $3_k$. It will be presumed that a binary 1 is entered into, maintained in, and recalled from the $k$th CCD $2_k$ by causing a relatively high density of minority carriers to be injected into, maintained in, or to flow within the depletion regions in the epitaxial layer 11. Furthermore it will be presumed that a binary 0 is entered into, maintained in, and recalled from the $k$th CCD $2_k$ by causing a relatively low density of minority carriers to be injected into, maintained in, or to flow within the depletion regions in the epitaxial layer 11.

Under these presumptions, to maintain whatever data has been most recently entered into the array of CCDs $2_1, 2_2, \ldots 2_{N \times M}$ by means to be discussed, a voltage of level $V_1$ must be maintained on all the Y conductive strips $4_1, 4_2, \ldots 4_M$, a voltage of level $V_3$ must be maintained on all the X conductive strips $6_1, 6_2, \ldots 6_N$, and all the conducting terminals $8_1, 8_2, \ldots 8_M$ may be maintained at ground potential. In the description of the entering of data, the recalling of data, and the refreshing of data, unless otherwise specifically stated all the conductive terminals $8_1, 8_2, \ldots 8_M$ and all the X and Y conductive strips $6_1, 6_2, \ldots 6_N, 4_1, 4_2, \ldots 4_M$ are maintained at the voltage levels specified above.

To enter a 1 in the $k$th CCD $2_k$, the voltage applied to the Nth X conductive strip $6_N$ is changed from the voltage level $V_3$ to the voltage level $V_2$, and then a voltage of level $V_6$ is applied to the rth conducting terminal $8_r$. Majority charge carriers from the rth semiconductor strip $7_r$ will flow into the epitaxial layer 11 where the carriers become minority charge carriers. Some fraction of these minority charge carriers will diffuse and drift to the boundry of the depletion layer beneath the $k$th X electrode $5_k$, pass into the depletion layer, and drift under the influence of the electric field in the said depletion layer. These minority carriers accumulate at that region of the surface of the epitaxial layer 11 beneath the $k$th X electrode $5_k$. After a relatively large number of minority carriers have accumulated beneath the $k$th X electrode $5_k$, the voltage applied to the rth conducting terminal $8_r$ may be reset to ground potential and the voltage applied to the Nth X conductive strip $6_N$ may be changed to the voltage level $V_3$. Some or all of the minority carriers that had accumulated under the kth X electrode $5_k$ will drift and diffuse toward the $k$th Y electrode $3_k$. Using the techniques and procedures described above a 1 has been entered into the $k$th CCD $2_k$ regardless of what data had previously been entered and maintained by the $k$th CCD $2_k$. Furthermore that the above has been accomplished without destroying the data being maintained in any of the other CCDs $2_1, 2_2, \ldots 2_{k-1}, 2_{k+1}, \ldots 2_{N \times M}$ can be established by the following considerations. All of the CCDs $2_1, 2_2, \ldots 2_{k-1}, 2_{k+1}, \ldots 2_{N \times M}$ are included in one of the following groups:

Group I CCDs are those which have neither their X electrodes connected to the Nth X conductive strip $6_N$, and do not have their X electrodes directly above the $r$th semiconductor strip $7_r$. The minority carrier density in the depletion regions of these CCDs and hence the data being maintained by these CCDs are unaffected by the voltage changes on the Nth conductive strip $6_N$ or by the voltage changes on the $r$th semiconductor strip $7_r$.

Group II CCDs are those which have their X electrodes connected to the Nth conductive strip $6_N$ but do not have their X electrode directly above the $r$th semiconductor strip $7_r$. In such devices, when the voltages on the Nth conductive strip $6_N$ changes from $V_3$ to $V_2$, some or all of the minority carriers, if any exist, beneath their respective Y electrodes are transferred to the depletion regions beneath their respective X electrodes. When the voltage on the Nth X conductive strip $6_N$ is returned to the voltage level $V_3$, the minority carriers so transferred return to beneath their respective Y electrodes. Therefore the data being maintained by these devices are not destroyed by the operation of writing a 1 in the $k$th CCD $2_k$.

Group III CCDs are those which have their X electrode above the rth semiconductor strip $7_r$, but do not have their X electrode connected to the Nth conductive strip $6_N$. Minority carriers injected from the $r$th semiconductor strip $7_r$ into the epitaxial layer 11 recombine with majority carriers before they reach the edge of the depletion layers beneath either the X electrode or beneath the Y electrode of such CCDs. Therefore the data being maintained in these devices is not destroyed by the operation of writing a 1 in the $k$th CCD $2_k$.

An alternative process for entering a 1 in the $k$th CCD $2_k$ is to first recall the data being maintained in the $k$th CCD $2_k$, by means to be described. If a 1 is already being maintained in the $k$th CCD $2_k$, no further procedures are necessary. If a 0 is being maintained in the $k$th CCD $2_k$, a 1 must be entered using the procedures described above for entering a 1 in the $k$th CCD $2_k$.

To enter a 0 into the $k$th CCD $2_k$, a voltage of level $V_4$ is applied to the $r$th Y conductive strip $4_r$, and a voltage of level $V_5$ is applied to the Nth X conductive strip $6_N$. Majority carriers from the epitaxial layer 11 will recombine with any minority carriers that may have existed in the depletion regions beneath the $k$th X electrode $5_k$ and beneath the $k$th Y electrode $3_k$. After a time interval sufficient to allow the majority carriers to reduce the minority carrier density to some low value, the voltage applied to the $r$th Y conductive strip $4_r$ is reset to $V_1$ and the voltage applied to the Nth X conductive strip $6_N$ is reset to $V_3$. Using the techniques and procedures described above a 0 has been entered in the $k$th CCD $2_k$ regardless of what data had previously been entered and maintained in the $k$CCD $2_k$. Furthermore, that the above has been accomplished without destroying the data being maintained in any of the other CCDs $2_1, 2_2, \ldots 2_{k-1}, 2_{k+1}, \ldots 2_{N \times M}$ can be established by the following considerations. All of the CCDs $2_1, 2_2, \ldots 2_{N \times M}$ except the $k$th CCD $2_k$ are included in one of the following groups:

Group IV CCDs are those which do not have their X electrode connected to the Nth X conductive strip $6_N$ and do not have their Y electrode connected to the $r$th Y conductive strip $4_r$. The minority carrier density in the depletion regions of these CCDs and therefore the data being maintained by these CCDs are unaffected by the voltage changes on the Nth X conductive strip $6_N$ and are unaffected by the voltage changes on the $r$th Y conductive strip $4_r$.

Group V CCDs are those which have their X electrodes connected to the Nth X conductive strip $6_N$ and do not have their Y electrodes connected to the $r$th Y conductive strip $4_r$. In these devices, when the voltage level on the Nth X conductive strip $6_N$ changes from the voltage level $V_3$ to the voltage level $V_5$, minority carriers, if any exist, beneath their respective X electrodes flow to beneath their respective Y electrodes. When the voltage level on the Nth X conductive strip $6_N$ changes from the voltage level $V_5$ to the voltage level $V_3$, some of the minority carriers, if any, beneath their respective Y electrodes flows to beneath their respective X electrodes. At the conclusion of the process of entering a 0 in the $k$th CCD $2_k$, the density of minority carriers beneath the Y electrodes of Group V CCDs has not been significantly changed. Therefore the data being maintained by these devices are not destroyed by the operation of writing a 0 in the $k$th CCD $2_k$.

Group IV CCDs are those which have their Y electrode connected to the $r$th conductive strip $4_r$ but do not have their X electrode cannected the Nth X conductive strip $6_N$. In these devices, when the voltage level on the $r$th Y conductive strip $4_r$ changes from the voltage level $V_1$ to the voltage level $V_4$ some or all of the minority carriers, if any exist, beneath their respective Y electrodes flow to the depletion region beneath their respective X electrodes. When the voltage level on the $r$th Y conductive strip $4_r$ is changed from the voltage level $V_4$ to the voltage level $V_1$, some or all of the minority carriers which flowed to beneath their respective X electrodes returns to beneath their respective Y electrodes. At the conclusion of the process of entering a 0 in the $k$th CCD $2_k$ the density of minority carriers beneath the Y electrode of Group VI CCDs has not been significantly changed. Therefore the data being maintained by these devices is not destroyed by the operation of writing a 0 in the kth CCD $2_k$.

An alternative process for entering a 0 in the $k$th CCD is to first recall the data being maintained in the $k$th CCD $2_k$, by means to be described. If a 0 is already being maintained in the $k$th CCD $2_k$, no further procedures are necessary. If a 1 is being maintained in the $k$th CCD $2_k$, a 0 must be entered using the procedures described above for entering a 0 in the $k$th CCD $2_k$.

To recall the data being maintained in the $k$th CCD $2_k$, the level of the voltage applied to the Nth X conducting strip $6_N$ is rapidly changed from $V_3$ to $V_2$. If any minority carriers were located at the surface of the epitaxial layer 11 beneath the $k$th Y electrode $3_k$, they will flow towards the $k$th X electrode $5_k$. The change in charge distribution beneath the $k$th Y electrode $3_k$ causes a current to flow in the $r$th Y conductive strip $4_r$. After a time interval sufficient to allow some or all of any minority carriers present to make the transfer, the voltage applied to the Nth X conductive strip $6_N$ is rapidly changed back to the voltage level $V_3$. If any minority carriers were transferred from beneath the $k$th Y electrode $3_k$ to beneath the $k$th X electrode $5_k$, some or all of these minority carriers now flow back to beneath the $k$th Y electrode $3_k$, and as a result a current flows in the $r$th Y conductive strip $4_r$. These currents may be detected by suitable electronic devices connected to the $r$th Y conductive strip $4_r$. The currents resulting from either the first charge transfer or the second charge transfer, or both may be used as an indication of the density of minority carriers stored in the depletion layer of the $k$th CCD $2_k$. Using the techniques and procedures described above, the data most recently entered in the $k$th CCD $2_k$ has been recalled without destroying the data being maintained in any of the CCDs $2_1, 2_2, \ldots 2_{N \times M}$ as will be established by the following considerations. All of the CCDs $2_1, 2_2, \ldots 2_{N \times M}$ except the $k$th CCD $2_k$ are included in one of the following groups:

Group VII CCDs are those which do not have their X electrodes connected to the Nth conductive strip $6_N$. The minority carriers, if any, being maintained in the depletion regions of these devices, and therefore the data being maintained by these CCDs is unaffected by the operation of recalling the data being maintained in the $k$th CCD $2_k$.

Group VIII CCDs are those which have their X electrodes connected to the Nth conductive strip $6_N$. During the operations for the recall of the data being maintained in the $k$th CCD $2_k$ the minority carriers, if any, being maintained in the depletion regions of the Group VIII CCDs undergo the same series of transfers as do the minority carriers being maintained in the $k$th CCD $2_k$. For the same reasons that the data being maintained in the $k$th CCD $2_k$ is not altered by the operation of recalling the data from the $k$th CCD $2_k$, the data being maintained in the Group VIII CCDs is not altered by the operation of recalling the data from the $k$th CCD $2_k$.

Referring to the discussion of Group VIII CCDs above, it is evident that the data in all the Group VIII CCDs and the data in the $k$th CCD $2_k$ can be recalled simultaneously by providing the appropriate electronic devices to detect the currents in all the Y conducting lines $4_1, 4_2, \ldots 4_M$.

Periodically it is necessary to refresh the data that is being maintained in the array of CCDs $2_1, 2_2, \ldots 2_{N \times M}$. A periodic refresh cycle is required because of the generation of minority carriers within and near the depletion regions of the CCDs $2_1, 2_2, \ldots 2_{N \times M}$. The maximum time interval between refresh cycles is dependent on the material used in the manufacture of the CCDs $2_1, 2_2, \ldots 2_{N \times M}$, the sensitivity of the current detecting electronic devices, the temperature of the epitaxial layer 11, and other factors.

To refresh the data being maintained in the CCDs $2_1, 2_2, \ldots 2_{N \times M}$ the data must first be recalled using the procedures described previously for recalling data. If it is determined that a 0 is being maintained in the $k$th CCD $2_k$, a 0 must be re-entered in the $k$th CCD $2_k$. If it is determined that a 1 is being maintained in the $k$th CCD $2_k$, it is not necessary to re-enter a 1 in the $k$th CCD $2_k$. The CCDs $2_1, 2_2, \ldots 2_{N \times M}$ may be recalled a row at a time as has been previously discussed.

A 1 can be entered in all the CCDs $2_1, 2_2, \ldots 2_{N \times M}$ by maintaining for a sufficient length of time all the X conductive strips $6_1, 6_2, \ldots 6_N$ at a voltage of level $V_3$ and maintaining for a sufficient length of time all the Y conductive strips $4_1, 4_2, \ldots 4_M$ at a voltage of level $V_1$.

A 0 can be entered in all the CCDs $2_1, 2_2, \ldots 2_{N \times M}$ by maintaining for a sufficient length of time all the X conductive strips $6_1, 6_2, \ldots 6_N$ at a voltage of level $V_5$ and maintaining for a sufficient length of time all the Y conductive strips $4_1, 4_2, \ldots 4_M$ at a voltage of level $V_4$, and then returning all the X conductive strips $6_1, 6_2, \ldots 6_N$ to a voltage of level $V_3$ and returning all the Y conductive strips $4_1, 4_2, \ldots 4_M$ to a voltage of level $V_1$.

The semiconductor device of the present invention can be made of high density by integrated circuit techniques and MISFETs may be incorporated into the same semiconductor substrate 10 and epitaxial layer 11 to effect the address decoding and current sensing. The device being simple in structure requires a minimum of processing steps in its manufactures, has high reproducibility and allows for high frequency entering and recalling of data. In one embodiment, having only two surface electrodes, the device of the present invention requires a minimized semiconductor surface area per stored bit. In this, and other ways, the device according to the present invention has superior features.

It is to be understood that the form of the invention herewith shown and described is to be taken as a preferred embodiment. Various changes may be made in the shape, size, and arrangement of parts.

I claim:

1. In a random access memory of the class wherein
   a plurality of memory cells, all of substantially identical electrical characteristics, are disposed in a two dimensional array of rows an columns such that each one of said memory cells appear in one of the rows and in one of the columns,
   said memory being comprised of a semiconducting material, a plurality of first electrodes, a plurality of second electrodes, a plurality of row conductive means, and a plurality of column conductive means,
   said first and said second electrodes being in proximity to and electrically insulated from said semiconducting material, and
   each of said memory cells being comprised of one of said first electrodes and one of said second electrodes, and
   said row conductive means being electrically connected to the said memory cells such that the said first electrodes of all of those said memory cells appearing in the same one of the said rows are connected in common, and
   said column conductive means being electrically connected to said memory cells such that the said second electrodes of all of those said memory cells appearing in the same one of the said columns are connected in common,
   in each of the said memory cells, a first inversion region is formed in the semiconducting material by maintaining the electrical potential between each of the said first electrodes and the said semiconducting material within an appropriate range of potentials,
   to store a 0 in any one of the said memory cells, a relatively small number of minority carriers is stored in the said first inversion region of that said one memory cell, and
   to store a 1 in any one of the said memory cells, a relatively large number of minority carriers is stored in the said first inversion region of that said one memory cell, and
   in said memory, the minimum time interval required to enter datum in any particular one of said memory cell is substantially independent of the location of that said one memory cell, and
   in said memory, the minimum time interval required to recall the datum stored in any particular one of said memory cells is substantially independent of the location of that said one memory cell,
   a method of non-destructively recalling the data stored in any particular one of said columns of memory cells comprising the steps of
   applying an appropriate potential between said semiconducting material and that one of said column conductive means which is connected to the said second electrodes of those said memory cells in said particular column of memory cells, such that
   within each of said memory cells in said particular column of memory cells, a second inversion region in said semiconducting material is formed such that each one of said second inversion regions is isolated and distinct from every other one of said second inversion regions, and such that
   within each of said memory cells in the said particular column of memory cells, the said second inversion region formed therein overlaps the said first inversion region formed therein, such that minority carriers stored in the said first inversion region in each particular one of said memory cells in said particular column of memory cells, transfer to and remain within the said second inversion region formed in said particular one memory cell,
   transferring back to within each of said first inversion regions in said particular column of memory cells substantially the same number of minority carriers stored therein just prior to the previously described transfer of said minority carriers from said first inversion regions to said second inversion regions, by applying a second appropriate potential between said semiconducting material and that one of the said column conductive means which is connected to the said second electrodes of those said memory cells in said particular column of memory cells, such that said second inversion regions are extinguished and such that upon extinguishing said second inversion regions, most of any minority carriers which had transferred from a particular one of said first inversion regions to a particular one of said second inversion regions transfer back to said particular one of said first inversion regions,
   utilizing the charge flow on each of the said row conductive means resulting from the aforementioned transfers of minority carriers between said first and said second inversion regions to determine the data stored in the said memory cells in said particular column of memory cells.

2. The method of claim 1 wherein the charge flow on each of the said row conductive means resulting from the transfer of said minority carriers from said first inversion region to said second inversion region is utilized to determine the data stored in the said memory cells in said particular column of memory cells.

3. The method of claim 1 wherein the charge flow on each of the said row
   conductive means resulting from the said transfer of minority carriers from said second inversion regions to said first inversion regions is utilized to determine the data stored in the said memory cells in said particular column of memory cells.

4. The method of claim 1 wherein a sense amplifier, electrically connected
to a particular one of said row conductive means is operated such that subsequent to recalling the data stored in any particular one of said columns of memory cells, the state of said sense amplifier is indicative of the datum stored in that particular one of said memory cells which is both connected to that said particular one of said row conductive means to which said sense amplifier is connected and appears in said particular column of memory cells.

5. The method of claim 1 wherein a plurality of sense amplifiers are electrically connected to a plurality of said row conductive means and operated such that subsequent to recalling the data stored in any particular one of said columns of memory cells, the state of any particular one of said sense amplifiers is indicative of the datum stored in that particular one of said memory cells which is connected to the same particular one of said row conductive means to which the said particular sense amplifier is connected and which appears in said particular column of memory cells.

6. The method of claim 1 wherein to enter a 1 in any particular one of said memory cells, a PN junction formed in said semiconducting material in proximity to said particular one of said memory cells, is forward biased, thereby injecting minority carriers in to said particular one of said memory cells.

7. The memory of claim 1 wherein to enter a 0 in any particular one of said memory cells, both said first and said second inversion regions formed in said particular memory cell are extinguished, thereby permitting majority carriers from said semiconducting material to recombine with most of any minority carriers within said memory cell.

* * * * *